Aug. 29, 1972 MASAHIKO OGIRIMA ET AL 3,687,744

METHOD FOR PRODUCING INJECTION TYPE LIGHT EMITTING SEMICONDUCTOR DEVICES HAVING AN EPITAXIAL LAYER OF NITROGEN-DOPED GALLIUM PHOSPHIDE

Filed June 26, 1970

United States Patent Office
3,687,744
Patented Aug. 29, 1972

3,687,744

METHOD FOR PRODUCING INJECTION TYPE LIGHT EMITTING SEMICONDUCTOR DEVICES HAVING AN EPITAXIAL LAYER OF NITROGEN-DOPED GALLIUM PHOSPHIDE

Masahiko Ogirima, Shinjuku-ku, Hazime Kusumoto, Minamitama-gun, and Toshimitu Shinoda, Nishitama-gun, Japan, assignors to Dynamit Nobel Aktiengesellschaft, Troisdorf, Germany Filed June 26, 1970, Ser. No. 50,171
Claims priority, application Japan, June 27, 1969, 44/50,396
Int. Cl. H01l 7/36, 7/38
U.S. Cl. 148—175 20 Claims

ABSTRACT OF THE DISCLOSURE

Injection type light emitting semiconductor devices are produced by growing an epitaxial layer of gallium phosphide on a semiconductor substrate having a zinc blende or diamond type crystalline structure utilizing a vapor growth process, simultaneously contacting ammonium halide gas produced from a solid ammonium halide, such as $NH_4Cl$, $NH_4F$, $NH_4Br$ or $NH_4I$, with the growing layer of gallium phosphide to introduce nitrogen into the epitaxial layer of gallium phosphide, forming a p-n junction in the nitrogen-doped epitaxial layer of gallium phosphide by means of diffusion, and providing electrodes on the p and n regions, respectively, utilizing an alloying and a vacuum evaporating process.

BACKGROUND OF THE INVENTION

This invention relates to injection type light emitting semiconductor devices. More particularly, it relates to a method for producing injection type light emitting semiconductor devices having a nitrogen-doped epitaxial growth layer of gallium phosphide.

It is generally known that a p-n junction within an epitaxial growth layer of gallium phosphide emits a green light having a wavelength of 5650 A. when a forward current is applied thereto. This characteristic is utilized in light emitting diodes and in transistors or integrated circuit devices which utilize a light as a signal transmissive medium. These semiconductor devices are generically known as injection-type light emitting semiconductor devices, because of the mechanism which causes the emission of electroluminescent light as a result of recombination of injected minority carriers at the p-n junction in the semiconductor devices.

An example of an injection type light emitting semiconductor device is a light emitting diode which usually comprises a semiconductor substrate having a crystalline structure which is the same or similar to that of gallium phosphide (i.e., a zinc blende type structure such as gallium arsenide or a diamond type crystalline structure such as silicon and germanium), an epitaxial layer of gallium phosphide grown on the substrate, a p-n junction formed in the epitaxial growth layer and electrodes ohmically contacting the p and n regions, respectively. This light emitting diode emits a green light having a wavelength of 5650 A. from the p-n junction when a forward current is supplied to the p-n junction through the electrodes.

A conventional method commonly employed for preparing the light emitting diode uses gallium as a source material and a single crystal seed of a semiconductor material having a crystalline structure which is the same or similar to that of gallium phosphide. The material having a zinc blende type crystalline structure, such as gallium arsenide, or a diamond type crystalline structure, such as silicon and germanium, and the gallium source material are disposed and spaced from each other in a reaction tube, such as a quartz tube. The reaction tube is heated in such a manner that the gallium is heated to a higher temperature than the single crystal seed. A phosphorous halide, such as $PCl_3$, contained in a hydrogen stream is supplied to the reaction tube in the gaseous state. The gallium, the phosphorous halide and the hydrogen react to form a gaseous source material including gallium chloride gas, hydrogen chloride gas and phosphorus gas, for example. This gaseous source material is contacted with the seed crystal, causing a layer of gallium phosphide to epitaxially grow on the seed crystal. Then, the p-n junction is formed in the epitaxial growth layer of gallium phosphide by a diffusion method. Ohmic contacts for the electrodes are then formed on the p and n regions, respectively, using conventional methods, such as an alloy method and a vacuum evaporation method. The external quantum efficiency of the electroluminescence of the green emitting light of this light emitting diode is about $10^{-2}$ percent. This is too low for practical use.

It has recently been reported ["Efficient Green Electroluminescence in Nitrogen-Doped GaP p-n Junction," Applied Physics Letters, vol. 13, No. 4, pp. 139–141] that the external quantum efficiency of the electroluminescence of the green emitting light increases to about twice that of diodes prepared by conventional methods, when an epitaxial layer of nitrogen-doped gallium phosphide is used. In this paper, it is reported that the nitrogen-doped epitaxial growth layer of gallium phosphide is produced by a liquid-base epitaxy process in which ammonia gas is introduced. Although this method provides an injection-type light emitting device having a high external quantum efficiency of green emitting light, it has the following unavoidable drawbacks:

It is essential that the ammonia gas introduced into the reaction tube be purified. In order to purify the ammonia gas, ammonia gas from a gas cylinder is liquefied and metallic natrium (sodium) is put into the liquefied ammonia gas. Thereafter, the liquefied ammonium gas is vaporized and is introduced into the reaction tube. These steps pose great problems and disadvantages for producing injection-type light emitting semiconductor devices. Moreover, since ammonia gas is corrosive and noxious, precautions must be taken to avoid leaks, and this can be quite difficult and troublesome.

The external quantum efficiency of the electroluminescence of the green emitting light is influenced by the quantity of nitrogen in the epitaxial growth layer of gallium phosphide. Since ammonia gas is liquefied in the procedure and then metallic sodium is put into the liquefied ammonia and, after these steps, the liquefied ammonia is vaporized, control of the quantity of ammonia gas which is introduced into the reaction tube is very difficult. Accordingly, the quantity of nitrogen doped into the epitaxial growth layer of gallium phosphide is difficult to control. The yield rate of epitaxial growth layers of gallium phosphide doped with a constant quantity of nitrogen is therefore low. Thus, the yield rate of injection-type light emitting semiconductor devices made in this manner is correspondingly low.

SUMMARY OF THE INVENTION

One of the objects of the present invention is to provide an improved method for producing injection type light emitting semiconductor devices which overcomes the disadvantages and drawbacks of the prior art procedures.

Another object of the invention is to provide a method for producing injection type light emitting semiconductor devices having nitrogen-doped epitaxial layers of gallium phosphide.

A further object of the invention is to provide a method for producing injection type light emitting semiconductor devices which can be readily produced on a mass production basis.

A still further object of the invention is to provide an improved method for producing a nitrogen-doped epitaxial growth layer of gallium phosphide for injection type light emitting semiconductor devices.

Yet another object of the invention is to provide injection type light emitting semiconductor devices.

These and other objects and advantages of the present invention will become apparent to those skilled in the art from a consideration of the following specification and claims, taken in conjunction with the accompanying drawing.

Basically, the present invention provides a method in which an epitaxial layer of gallium phosphite is grown on the semiconductor material having a zinc blende type crystalline structure or a diamond type crystalline structure by a vapor growth process, and simultaneously contacting ammonium halide gas produced from an ammonium halide, such as $NH_4Cl$, $NH_4F$, $NH_4Br$ or $NH_4I$, with the growing gallium phosphide to introduce nitrogen into the epitaxial growth layer of gallium phosphide.

The quantity of nitrogen in the gallium phosphite layer is an infinitesimal quantity, ranging from about $10^{16}$ atoms/cc. to about $10^{19}$ atoms/cc. Therefore, only a small amount of ammonia gas needs to be contained in the reaction gas. In the above-mentioned conventional method for producing a nitrogen-doped gallium phosphide epitaxial growth layer, ammonia is used. However, ammonia is usually in the gaseous or liquid form. When ammonia is used in a vapor growth method for producing a nitrogen-doped gallium phosphide epitaxial layer, it should be changed to the gaseous form even though it may initially be present as a liquid, as discussed above. The quantity of ammonia gas is controlled, for example, by a needle valve when it is introduced into the reaction tube in order to put an infinitesimal quantity of nitrogen into a growing gallium phosphide layer. However, since a needle valve comprises a mechanical means of control, an insufficient control on the quantity of ammonia gas results using this technique.

On the other hand, in the present invention, ammonium halides which are in a solid form are introduced. Accordingly, it is much easier to control the quantity of ammonia gas by means of the treatment of the ammonium halide. The quantity of ammonia gas is controlled by temperature, which is a great advantage because ammonia gas provides a vapor pressure which is accurately controlled by temperature.

BRIEF DESCRIPTION OF THE DRAWING

Other objects and advantages of this invention will be apparent from the following description, taken in connection with the accompanying drawing wherein.

DETAILED DESCRIPTION OF THE PREFERRED EMBODIMENTS

Figure 1:
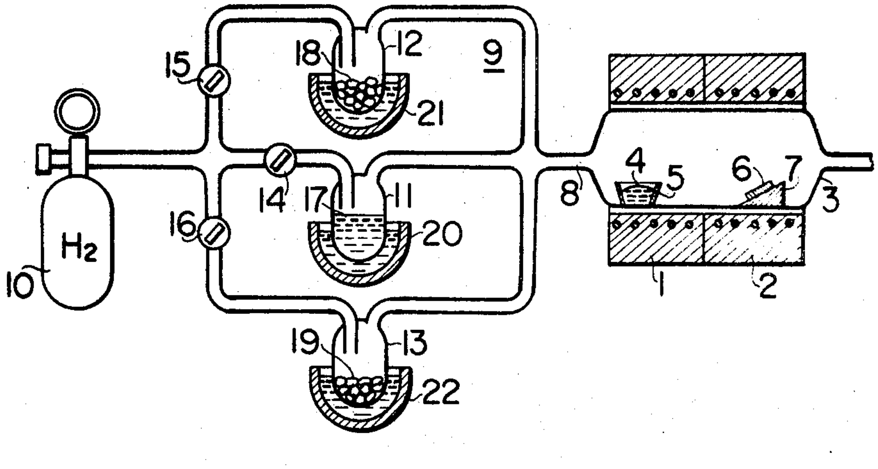
FIG. 1 schematically illustrates an apparatus for performing the method of the present invention.
Figure 2:
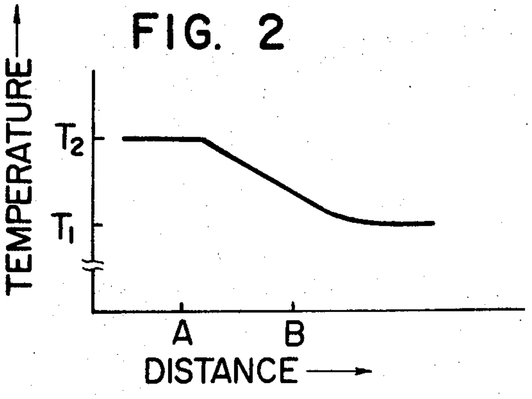
FIG. 2 shows the distribution of the temperature in the reaction tube in FIG. 1, and FIGS. 3, 4 and 5 illustrate the method for producing the light emitting diode in connection with the present invention.

Referring now to FIGS. 1 and 2, the basic principle for manufacturing a vapor growth layer of nitrogen-doped gallium phosphide by means of a disproportionation reaction is shown therin. In FIG. 1, electric furnaces 1 and 2 surround a reaction tube 3, made of a material such as quartz. In the quartz reaction tube 3, a suitable mass of gallium 4 in a vessel 5, also made of a material such as quartz, and a seed crystal plate or substrate of gallium arsenide 6 on a stage 7 are disposed as shown. The stage 7 is inclined so that the surface of the seed crystal substrate 6 contacts with the reaction gas uniformly in order to maintain a temperature range which is as narrow as possible. A line for reaction gas 9 is connected to the reaction tube 3 at the side of the mass of gallium 4 in the reaction tube 3 as shown.

Hydrogen gas from a hydrogen gas cylinder 10 is introduced into evaporating vessels 11, 12 and 13 through needle valves 14, 15 and 16, respectively. The needle valves 14, 15 and 16 control the quantity of the hydrogen gas to be introduced into the evaporating vessels 11, 12 and 13. For example, $PCl_3$ (liquid) 17, $NH_4Cl$ (solid) 18 and S (solid) 19 settle in the evaporating vessels 11, 12 and 13, respectively. The evaporating vessels 11, 12 and 13 are maintained at desired temperatures by thermostats 20, 21 and 22, respectively.

Argon is introduced into the entrance of the reaction tube 3 from another path (not shown) in order to obtain an inert atmosphere in the reaction tube 3. Then, the temperatures of gallium 4 and gallium arsenide 6 are controlled at $T_1$ and $T_2$, respectively, with the furnaces 1 and 2. An example of the temperature distribution in the reaction tube 3 is shown by the curve in FIG. 2. In FIG. 2, letters A and B show the locations of gallium 4 and gallium arsenide 6, respectively. After the temperature in the reaction tube 3 becomes stable, the carrier gas $H_2$ containing $PCl_3$, $NH_4Cl$ and S gas is introduced into the reaction tube 3. The mixture of $H_2$, $PCl_3$, $NH_4Cl$ and S is formed when $H_2$ passes through the evaporating vessels 11, 12 and 13, in which the $PCl_3$, $NH_4Cl$ and S are maintained at particular temperatures by thermostats 20, 21 and 22, as noted above. The quantity of $PCl_3$, $NH_4Cl$ and S gas in the $H_2$ gas is controlled by changing the temperatures of the thermostats 20, 21 and 22, respectively.

When the temperature $T_1$ of gallium 4 and the temperature $T_2$ of gallium arsenide 6 are set at 950° C. and 800° C., respectively, the temperatures of the thermostats 20, 21 and 22, that is, the temperatures of the evaporating vessels 11, 12 and 13, are set at 0° C., −70° C. and 30° C., respectively. The flow rate of $H_2$ onto the $NH_4Cl$ is 40 cc./min., n-type gallium phosphide having a specific resistance of 0.05Ω·cm. being grown on the gallium arsenide substrate 6 with a growth speed of 5000 A./min. The growth layer of n-type gallium phosphide contains a quantity of nitrogen of $10^{17}$ atoms/cc.

The quantity of nitrogen in the growth layer of gallium phosphide is controlled by the quantity of nitrogen in the reaction gas, i.e., the mixture of $H_2$, $PCl_3$, $NH_4Cl$ and S. In order to control the quantity of nitrogen gas, the temperature of the thermostat 21 is utilized, since it is possible to thereby control the quantity of nitrogen minutely.

The quantity of nitrogen in the growth layer of gallium phosphide ranges from about $10^{16}$ atoms/cc. to about $10^{19}$ atoms/cc., as described above. The reason for this particular range is that when the quantity of nitrogen in the gallium phosphide layer is less than $10^{16}$ atoms/cc., the external quantum efficiency of green emitting light of the light emitting semiconductor devices utilizing such a gallium phosphide is not improved to a great extent as compared with the conventional device, i.e., the light emitting semiconductor devices using gallium phosphide which do not contain nitrogen. When the quantity of nitrogen in the gallium phosphide layer is more than $10^{19}$ atoms/cc., the crystalline structure of the gallium phosphide layer becomes worse than that of the gallium phosphide layer provided by the conventional method, and the external quantum efficiency of green emitting light of the light emitting semiconductor devices utilizing such a gallium phosphide layer is lower than that of the light emitting semiconductor devices utilizing gallium phosphide which do not contain nitrogen.

According to the present invention, the quantity of $NH_4Cl$ flowing through the reaction tube is kept at from about $2.8\times10^{-7}$ mole/min. to about $2.8\times10^{-4}$ mole/min. in order to introduce a quantity of nitrogen of from about $10^{16}$ atoms/cc. to about $10^{19}$ atoms/cc. into the vapor growth layer of gallium phosphide.

While the above description specifically describes $NH_4Cl$ as the ammonium halide, it is, of course, to be understood that the $NH_4Cl$ can be replaced by any conventionally used ammonium halide, such as $NH_4F$, $NH_4Br$ or $NH_4I$.

Figure 3:
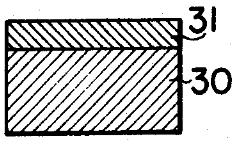
Figure 4:
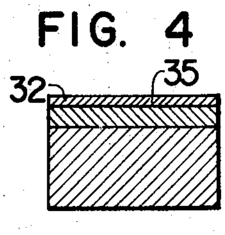
Figure 5:
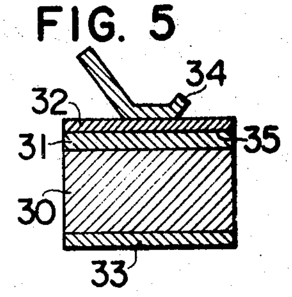

FIGS. 3, 4 and 5 show a process for producing the light emitting diode utilizing the vapor growth layer of nitrogen-doped gallium phosphide.

One of the surfaces of the gallium arsenide substrate 30 have a specific resistance of $5\times10^{-3}\Omega\cdot$cm. is etched in order to obtain a mirror-like surface, on which gallium phosphide is grown. After the etching process, gallium arsenide substrate 30 is set into the reaction tube as shown in FIG. 1, and the layer of nitrogen-doped gallium phosphide 31 having a thickness of about $100\mu$ is epitaxially grown on the substrate 30 by means of the process described above. A a result of this process, since the quantity of $NH_4Cl$ gas flowing through the reaction tube is about $2.8\times10^{-6}$ mole/min., the quantity of nitrogen in the vapor growth layer of gallium phosphide 31 is about $10^{17}$ atoms/cc.

Thereafter, p-type layer 32 (shown in FIG. 4) is fabricated by means of a conventional zinc diffusion.

An ohmic contact electrode of Ni 33 is deposited on the substrate 30, and another ohmic contact wire electrode of In-Zn alloy 34 is connected onto the p-type layer 32.

This light emitting diode emits a green light having a wavelength of 5650 A., when a forward current of 10 ma. is supplied to the p-n junction 35 through the electrodes 33 and 34. The external quantum efficiency of the electroluminescence of the green emitting light of this light emitting diode is about 0.05%. For comparing the external quantum efficiency of this light emitting diode with that of a conventional light emitting diode, a light emitting diode having the same structure as shown in FIG. 5, but not containing nitrogen in the vapor growth layer of gallium phosphide, is fabricated. The external quantum efficiency of this light emitting diode is about 0.01%.

As described above, the light emitting semiconductor devices produced according to the present invention have a high external quantum efficiency of the electroluminescence of the green emitting light. Also, this invention has the following merits:

(1) Utilizing the vapor growth method, the fabrication of the light emitting semiconductor devices and also the formation of the layer of nitrogen-doped gallium phosphide is relatively easy.

(2) The control of the infinitesimal quantity of nitrogen in the layer of gallium phosphide is accurate because ammonium halide, whose vapor pressure is controlled accurately by means of temperature, is used.

(3) Since the control of the quantity of nitrogen vapor is relatively simple and effective, the vapor growth layer of gallium phosphide contains an accurate quantity of nitrogen therein and, consequently, the yield rate of the light emitting semiconductor devices comprising the same is high.

It is to be understood that the materials specifically shown above are given by way of example only, and that other suitable substitutes therefore within the context of the invention may be employed. Thus, for example, phosphorous trichloride, $PCl_3$, can be replaced by any conventionally used phosphorus-containing gas, such as $PBr_3$, $PI_3$, $PBr_5$, $PI_5$ or a mixture of phosphorus or phosphine and hydrogen chloride. The basic principles of the invention would remain the same. Correspondingly, other suitable carrier gases or inert gas may be employed.

The invention being thus described, it will be obvious that the same may be varied in many ways. Such variations are not to be regarded as a departure from the spirit and scope of the invention, and all such modifications as would be obvious to one skilled in the art are intended to be included herein.

It is claimed:

1. A method for producing an injection type light emitting semiconductor device having a vapor growth layer of nitrogen-doped gallium phosphide comprising the steps of providing a semiconductor substrate having a zinc blende or a diamond type crystalline structure, producing a gaseous source material including a gallium gas, a phosphorous halide gas and an ammonium halide gas which is heated to a higher temperature than that of said semiconductor substrate, the amount of said ammonium halide gas being so selected as to have an amount to permit the controlling of the doping of nitrogen of an amount between $10^{16}$ atoms per cc. and about $10^{19}$ atoms per cc., transporting said gaseous source material onto said semiconductor substrate, whereby a vapor growth layer of nitrogen-doped gallium phosphide is produced on the substrate, fabricating at least one p-n junction within the vapor growth layer of nitrogen-doped gallium phosphide, and connecting ohmic contact electrodes onto the p and n regions, respectively.

2. The method of claim 1, wherein the ammonium halide gas is produced from a compound selected from the group consisting of $NH_4Cl$, $NH_4F$, $NH_4Br$ and $NH_4I$.

3. The method of claim 1, wherein the ammonium halide is $NH_4Cl$ and the phosphorous halide is $PCl_3$.

4. The method of claim 1, wherein the ammonium halide is $NH_4Cl$.

5. The method of claim 1, wherein the ammonium halide is $NH_4F$.

6. The method of claim 1, wherein the ammonium halide is $NH_4Br$.

7. The method of claim 1, wherein the ammonium halide is $NH_4I$.

8. The method of claim 4, wherein the amount of $NH_4Cl$ gas transported to said semiconductor substrate is about $2.8\times10^{-7}$ mole/min. to about $2.8\times10^{-4}$ mole/min.

9. The method of claim 1, wherein the quantity of nitrogen is controlled by means of the temperature of vaporization of the ammonium halide.

10. The method of claim 1, wherein the phosphorous halide is selected from the group consisting of $PCl_3$, $PBr_3$, $PI_3$, $PBr_5$, $PI_5$ and mixtures of phosphorous or phosphine and hydrogen chloride.

11. A method for producing a vapor growth layer of nitrogen-doped gallium phosphide for use in an injection type light emitting semiconductive device comprising the steps of providing a semiconductor substrate having a zinc blende or a diamond type crystalline structure, producing a gaseous source material including a gallium gas, a phosphorous halide gas and an ammonium halide gas, the amount of said ammonium halide gas being so selected as to have an amount to permit the controlling of the doping of nitrogen of an amount between $10^{16}$ atoms per cc. and about $10^{19}$ atoms per cc., heating said semiconductor substrate, heating said gaseous source material to a temperature higher than that of said semiconductor substrate, and exposing said semiconductor substrate to said gaseous source material, whereby a vapor growth layer of gallium phosphide is produced on the substrate.

12. The method of claim 11, wherein the ammonium halide gas is produced from a compound selected from the group consisting of $NH_4Cl$, $NH_4F$, $NH_4Br$ and $NH_4I$.

13. The method of claim 11, wherein the ammonium halide is $NH_4Cl$ and the phosphorous halide is $PCl_3$.

14. The method of claim 11, wherein the ammonium halide is $NH_4Cl$.

15. The method of claim 11, wherein the ammonium halide is $NH_4F$.

16. The method of claim 11, wherein the ammonium halide is $NH_4Br$.

17. The method of claim 11, wherein the ammonium halide is $NH_4I$.

18. The method of claim 14, wherein the amount of $NH_4Cl$ gas transported to said semiconductor substrate is about $2.8\times10^{-7}$ mole/min. to about $2.8\times10^{-4}$ mole/min.

19. The method of claim 11, wherein the quantity of nitrogen is controlled by means of the temperature of vaporization of the ammonium halide.

20. The method of claim 11, wherein the phosphorous halide is selected from the group consisting of $PCl_3$, $PBr_3$, $PI_3$, $PBr_5$, $PI_5$ and mixtures of phosphorous or phosphine and hydrogen chloride.

References Cited

UNITED STATES PATENTS 3,461,004 8/1969 Lochner et al. ------- 148—175

OTHER REFERENCES

Logan et al.—Efficient Green Electroluminescence . . .—Applied Physics Letters, vol. 13, No. 4, Aug. 15, 1968, pp. 139–141.

ROBERT D. EDMONDS, Primary Examiner

U.S. Cl. X.R.

252—62.3 GA; 317—235 R

UNITED STATES PATENT OFFICE
CERTIFICATE OF CORRECTION

Patent No. 3,687,744 Dated August 29, 1972

Inventor(s) Masahiko OGIRIMA, Hazime KUSUMOTO and Toshimitu SHINODA

It is certified that error appears in the above-identified patent and that said Letters Patent are hereby corrected as shown below:

Title page, as it reads:

assignors to Dynamit Nobel Aktiengesellschaft, Troisdorf, Germany should read:

assignors to Hitachi, Ltd., Tokyo, Japan

Signed and sealed this 13th day of November 1973.

(SEAL)
Attest:

EDWARD M.FLETCHER,JR.
Attesting Officer

RENE D. TEGTMEYER
Acting Commissioner of Patents